Aug. 18, 1970 L. J. STRIEDNIG 3,525,051

CASCADE CONNECTED REGENERATIVE AMPLIFIERS

Filed April 25, 1968

INVENTOR

Louis J. Striednig

BY Edward J. Norton

ATTORNEY 3,525,051
CASCADE CONNECTED REGENERATIVE AMPLIFIERS

Louis John Striednig, Old Bridge, N.J., assignor to RCA Corporation, a corporation of Delaware Filed Apr. 25, 1968, Ser. No. 724,153
Int. Cl. H03f 3/60
U.S. Cl. 330—56 8 Claims

ABSTRACT OF THE DISCLOSURE

An improved cascade coupled regenerative amplifier circuit is achieved first by adjusting the output gain of the first and third amplifier stages so as to be sharply peaked at the center frequency. Secondly, the center amplifier stage is load mismatched to reduce its feedback and gain sufficiently to provide adequate isolation between stages. Thirdly, the lower center stage gain is peaked slightly off the center frequency.

BACKGROUND OF THE INVENTION

Figure 1:
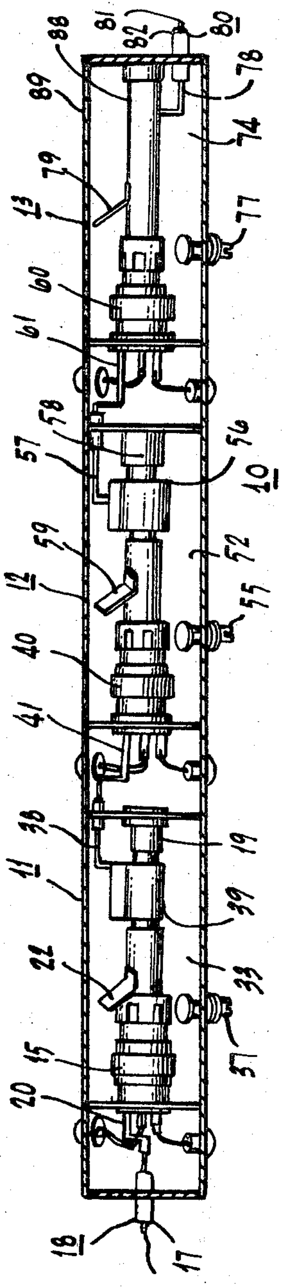

This invention relates to amplifier stages operated in cascade and more particularly to an improved cascade connected amplifier circuit with positive regenerative feedback which has increased usable gain over a relatively narrow pass band, sufficient stability, virtually no alignability problems associated with regenerative operation and has an amplitude response over the narrow pass band which closely approximates a Gaussian response.

It is often desirable in many applications to provide using only a few amplifier stages relatively high gain over a relatively narrow pass band of frequencies wherein there is exhibited a Gaussian amplitude response in that pass band. The preselector for an aircraft transponder is just such an application. In this application there is a need for a gain on the order of 43 db with a bandwidth at this point of approximately 7 mHz. when operating at a center frequency within the L-band of frequencies. The narrow pass band of frequencies and the magnitude of the gain must meet these tolerances so that unwanted signals such as jamming signals do not disable the receiver. In a transponder, an interrogator sends out a series of RF pulses at one frequency. The signal is decoded to determine if you are being interrogated or if the signal is meant for someone else. If you are being interrogated, a transmitter which is part of the system sends back the information that was asked in the form of a series of pulses a a different frequency. If the usable gain developed at the preselector is insufficient and the pass band of the preselector is not sufficiently narrow, the interrogator signal may be jammed or obscured and will not be recognized at the receiver resulting, for example, in a combat zone, the false firing of a missile causing the possible destruction of an oncoming friendly plane.

To simply connect three amplifier stages in cascade and tune each for maximum gain at the center frequency with positive feedback and high Q produces a wider signal than that which is desirable for this application and this broader bandwidth signal also has a severe rippled response with several peaks. To attempt to reduce the rippled response by simply reducing the feedback reduces the gain in each stage from, for example, 17 db to approximately 11 db per stage. In a requirement such as that described above where the output of the cascaded amplifier circuit is required using three amplifier stages to have a bandwidth of 7 mHz. at the 43 db point, both approaches would not meet the required standards necessary for safe operation.

It is therefore an object of this invention to provide an improved cascaded regenerative amplifier circuit that has increased usable gain over a relatively narrow pass band, sufficient stability, virtually no alignability problems associated with regenerative operation and has an amplitude response over the narrow pass band which closely approximates a Gaussian amplitude response.

BRIEF DESCRIPTION OF THE INVENTION

According to the present invention the elements which make up the tuned output circuit for the first and third amplifier stages of cascaded amplifiers are arranged so that these elements provide a high loaded Q (figure of merit) resonant circuit at the center frequency. The elements which make up the tuned output circuit of the center or second amplifier stage according to the present invention are arranged so that the elements provide a low loaded Q resonant circuit at a frequency slightly off the center frequency.

DESCRIPTION OF THE PREFERRED EMBODIMENT

The invention will be described in greater detail by reference to the accompanying drawings wherein the elements with like numerical labels represent as much as possible like elements.

Figure 2:
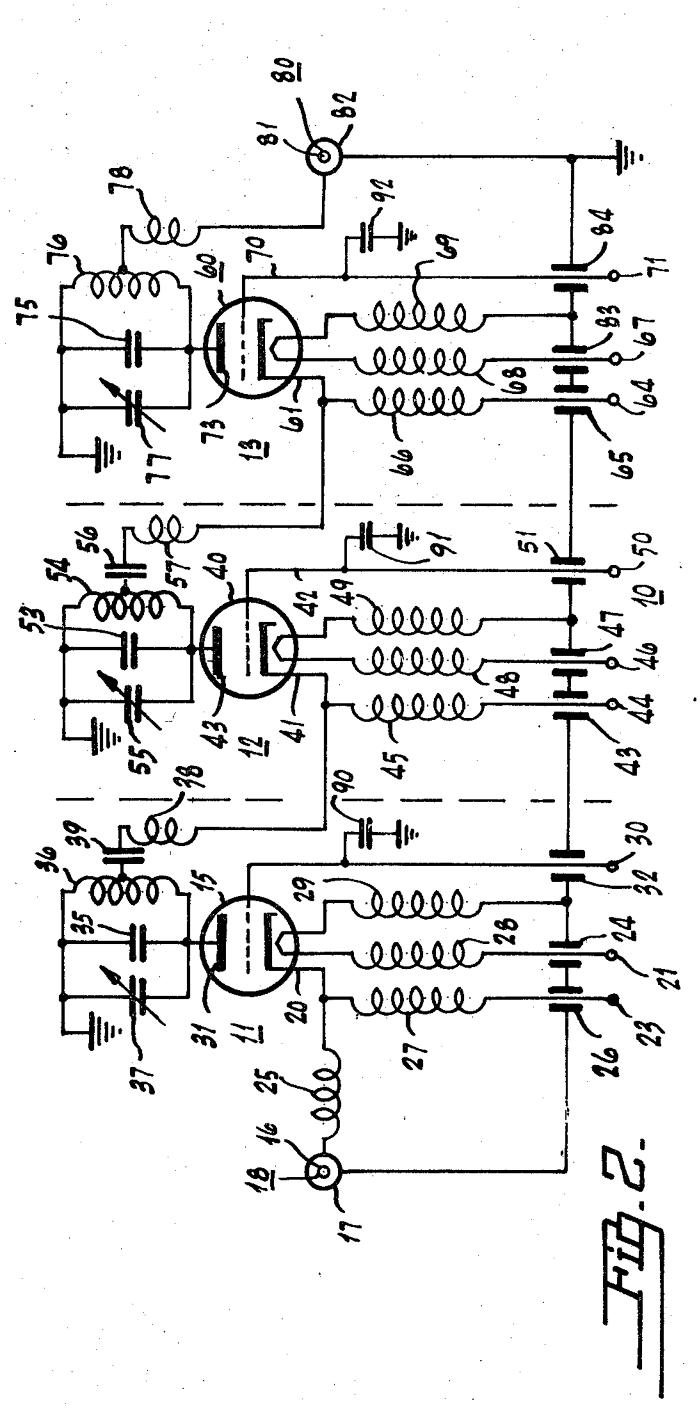

FIG. 1 illustrates a high gain narrow bandpass amplifier in accordance with a preferred embodiment of this invention, and FIG. 2 is a schematic representation of the amplifier shown in FIG. 1.

Referring to FIGS. 1 and 2 there is shown an RF amplifier made up of three cascaded coaxial amplifier stages 11, 12 and 13. Each of these stages is made up of a nuvistor tube mounted in a coaxial cavity and the output of each tube is tuned to a given frequency determined by the dimensions of the coaxial output cavity of the coaxial tube.

An RF (radio frequency) input signal from an outside source is coupled at coaxial input terminal 18 having a center conductor 16 and outer conductor 17. The center conductor 16 is coupled to cathode 20 of nuvistor tube 15 through impedance matching inductors 25 and 27 and the outer conductor coupled to the outer wall of the coaxial stage. A source of potential (B−) is applied at terminal 23 and is coupled through feedthrough capacitor 26 and inductance 27 to the cathode 20 of tube 15. Heater voltage for tube 15 is applied at terminal 21 and is coupled through feedthrough capacitor 24 to the heater. Inductors 28 and 29 are RF choke coils. The grid 21 is D.C. coupled to ground at terminal 30 through feedthrough capacitor 32. The RF signal at the grid is coupled to ground through capacitor 90. The output at tube 15 is taken at the plate 31. The dimensions and output circuit elements of the coaxial resonant cavity 33 are arranged so as to provide a high gain, high Q (figure of merit) resonant output circuit that is tuned to the center frequency. The dimensions and elements of the cavity 33 are represented schematically by the parallel resonant circuit comprising fixed capacitor 35 and inductor 36. The capacitive tuning stub 37 represented as a variable capacitor 37 provides frequency tuning of the cavity. Temperature compensation of the resonant cavity is provided by bimetallic element 22. The frequency selected output from the cavity 33 is coupled by metallic inductive coupling loop 38 through coupling capacitor 39 to the cathode 41 of nuvistor tube 16 of coaxial amplifier stage 12. The dimensions of the inner and outer conductor of cavity 33 and other tuning elements which make up the cavity are arranged so that the output of tube 15 is tuned to provide high gain at the center frequency with a high unloaded Q and with positive feedback. The positive feedback of the amplifier stage 11 is provided by means of the inherent interelectrode capacitance of the nuvistor tube 15. When operating for example in L-band the length of coaxial cavity 33 may be made just under 2 inches long and with an inner conductor diameter 19 of about ¼ inch and an outer conductor diameter 89 of 0.84 inch. The dimensions of the coupling loop 38 is made small (for example loop size 0.130+0.380 inch) so as to provide a low coefficient of coupling and therefore a correspondingly high loaded Q with positive feedback. When operating in the above example, a loaded Q of 70 is provided with a positive feedback on the order of 6%. With this arrangement a gain of about 17 db is provided with one stage with the bandwidth at —3 db points at 15 mHz. in L-frequency band.

The coupled output from coaxial amplifier stage 11 is amplified at the following coaxial stage 12 made up of nuvistor tube 40 mounted in the second coaxial cavity. The source of potential (B—) for the tube 40 is coupled to terminal 44 and is applied through a feedthrough capactor 43 and inductance 47 to the cathode 41 of tube 40. Heater supply voltage for nuvistor tube 40 of the second stage is applied to terminal 46. A heating circuit including a feedthrough capacitor 47, two RF choke inductances 48, 49 is coupled between terminal 46 and ground. The grid 42 of tube 40 is D.C. coupled to ground terminal 50 through feedthrough capacitor 51. The RF signal at the grid is coupled to ground through capacitor 91. The output from nuvistor tube 40 is taken at the plate 43 and applied to the second resonant coaxial cavity 52, represented schematically by the parallel resonant circuit comprising fixed capacitor 53 and inductor 54. The capacitive tuning stub 55 (represented schematically as variable capacitor 55) provides slight frequency tuning of the cavity. Temperature compensation of the resonant cavity is provided by bimetallic strip 59. The frequency selected output from cavity 52 is coupled by metallic coupling loop 57 and is applied through coupling capacitor 56 to the cathode 61 of the third stage nuvistor tube 60. The dimensions of the second output coaxial resonant cavity 52 and elements which control the tuning of the cavity are arranged so that output of the tube 40 is tuned about 15 mHz. below the center frequency with the same ratio of the outer conductors of the cavity. The cavity is made longer, for example, just over 2 inches, to lower the frequency with the diameter of the outer conductor being 0.84 inch and the inner conductor diameter being ¼ inch. The dimension of the coupling loop is increased (for example loop size 0.170+0.415 inch) so as to increase the coefficient of coupling causing a corresponding decrease in the positive feedback to about 3%, for example, and to cause a lower loaded Q of about one-half that of the previous Q or, for example, 35. With the lower loaded Q there is an increase to about twice the pass band with a gain in this stage for example of only 14.5 db at the —3 db point. The positive feedback for the amplifier stage 12 is provided by means of the inherent interelectrode capacitance of the tube 40. The amount the frequency of stage 12 is tuned below the center frequency is equal to one-half the —3 db pass band of this stage which for example would be 30 mHz. at L-band.

The coupled amplified output from coaxial amplifier stage 12 is amplified at the following coaxial amplifier stage 13 made up of a nuvistor tube 60 mounted in a third coaxial cavity. A negative potential source (B—) is applied to terminal 64 and is coupled to the cathode 69 through feedthrough capacitor 65 and inductance 66. Heater voltage is applied to terminal 67 and the heater for the tube is energized by a heater circuit including a feedthrough capacitor 83 in circuit with RF choke coils 68, 69 coupled to terminal 67. The grid 20 of tube 60 is D.C. coupled to ground potential at terminal 71 through feedthrough capacitor 84. The RF signal at the grid is coupled to ground through capacitor 92. The output of tube 60 is taken at the plate 73 and is applied to the resonant coaxial cavity 74, represented schematically as fixed capacitor 75 coupled in parallel with inductance 76. The capacitive tuning stub 77 (represented schematically as variable capacitor 77) provides slight frequency tuning of the cavity. Temperature compensation of the resonant cavity is provided by bimetallic strip 79. The frequency selected output from coaxial cavity 74 is applied directly through coupling loop 78 to the output terminal 80 made up of center conductor 81 and outer conductor 82. The dimensions of the cavity and elements which control the tuning of the cavity are arranged so as to provide at the output of tube 60 a high gain high Q resonant circuit that is tuned to the center frequency with positive feedback. The positive feedback for the amplifier stage 13 is provided by means of the interelectrode capacitance of the tube 60. The dimension, for example, of the cavity may be just under 2 inches long with a ¼ inch center conductor diameter and 0.84 inch outer conductor diameter 89. The dimension of the coupling loop 78 is made on the order of the small coupling loop 38 (for example loop size 0.120+0.300 inch) to provide a smaller coupling coefficient and consequently the higher loaded Q, for example, of 70 and the increased positive feedback in this stage to about 6%.

It has been found that by having the output circuit of the first and third amplifier stages tuned as described above at the center frequency with low coefficient of coupling between first and second stages and at the output of the third stage and by having the center stage tuned slightly off the center frequency and there being substantially higher coefficient of coupling between the second and third stages, a high gain Gaussian response over a narrow pass band is provided and a load mismatch is provided at the center stage. This load mismatch provides adequate isolation between the stages to overcome the alignability problems when using positive feedback which in turn prevents the severe ripples in the output. In the manner described above potentially unstable active devices are utilized and operate with terminal immittance mismatching to provide greater gain than unilateral gain while retaining satisfactory stability. The gains of the first and third stages are limited by the desired stability with load variation, the overall bandwidth, and the required response shape.

What is claimed is:

1. A cascade connected regenerative amplifier operable at a given center frequency comprising:
at least three amplifier stages coupled in cascade, each of said amplifier stage having a tuned output circuit and each having positive feedback to increase gain,
the output circuit of the first and third stages being tuned so as to resonate at said given center frequency and being adjusted so as to provide a high loaded Q tuned output circuit, and
the output circuit of the second stage being tuned so as to resonate off said given center frequency and being adjusted so as to provide a substantially lower loaded Q circuit to provide isolation between said stages.

2. A cascade connected amplifier operable at a given center frequency comprising:
at least three cascade connected amplifier stages, each of said amplifier stages having an output circuit and having positive feedback to increase usable gain, said positive feedback causing severe ripples in the total cascade connected amplifier output,
the output circuit of said first and third stages being arranged so as to resonate at said center frequency and the output circuit of the second stage being arranged so as to resonate slightly off said center frequency,
a first reactive coupling network having a first reactive portion and second reactive portion with mutual coupling therebetween coupled between said first and second stages and forming part of the output circuit of said first stage, the value of the reactance of each of said portions and the value of the mutual reactance between said first and second portions being determined to cause at the first stage optimum gain with a high loaded Q and high positive feedback, a second reactive coupling network having a third reactive portion and fourth reactive portion with mutual coupling therebetween forming part of said output circuit of said third stage, the value of the reactance of each of said third and fourth portions and the value of the mutual reactance between said third and fourth portions being determined to cause at the third stage optimum gain with said high loaded Q and high positive feedback, and a third reactive coupling network having a fifth reactive portion and sixth reactive portion with mutual coupling therebetween coupled between said second and third stages and forming part of said output of said second stage, the value of the reactance of each of said fifth and sixth portions and the value of the mutual reactance between said fifth and sixth portions being determined to cause at the second stage a substantially lower loaded Q and lower positive feedback whereby high uniform gain without severe ripples over a fairly narrow range of frequencies is provided.

3. The combination as claimed in claim 1 wherein said substantialy lower loaded Q is one-half the loaded Q of said first stage.

4. The combination as claimed in claim 2 wherein the output circuit of said second stage is tuned slightly below said center frequency.

5. In a cascaded coaxial amplifier operable at a given center frequency of the type having at least three coaxial amplifier stages wherein each stage includes an active circuit element mounted in a coaxial cavity and wherein the dimension of the output cavity determines the resonant frequency output of the stage, the improvement comprising:

each of said stages having positive feedback to increase gain, said positive feedback causing severe ripples in the total cascade connected amplifier output, the first and third stage output cavity being dimensioned so as to resonate at said center frequency, the second stage output cavity being dimensioned slightly longer than said first and third stages so as to resonate at a frequency slightly below said center frequency, a first reactive coupling network having a first reactive portion and second reactive portion with mutual coupling therebetween coupled between said first and second stages, the value of the reactance of each of said first and second portions and the value of the mutual reactance between said first and second portions being determined to cause at the first stage optimum gain with high loaded Q and high positive feedback, a second reactive coupling network having a third reactive portion and fourth reactive portion with mutual coupling therebetween forming part of said output circuit of said third stage, the value of the reactance of each of said third and fourth portions and the value of said mutual reactance between said third and fourth portions being determined to cause at the third stage optimum gain with said high loaded Q and high positive feedback, and a third reactive coupling network having a fifth reactive portion and sixth reactive portion with mutual coupling therebetween coupled between said second and third stages, the value of the reactance of each of said fifth and said sixth portions and the value of the mutual reactance between said fifth and sixth portions being determined to cause at the second stage a substantialy lower loaded Q and lower positive feedback whereby uniform high gain over a fairly narrow range of frequencies is provided.

6. A method of tuning at a given center frequency at least three cascade connected amplifier stages to increase usable gain, provide sufficient stability, to overcome alignability problems associated with regenerative operation and closely approximate a Gaussian response comprising the steps of;

tuning the output of the first and third stages at said given center frequency and adjusting the output gain of the first and third stage at a high loaded Q, and tuning the output of the second stage off said center frequency and adjusting the output gain of the second stage at a loaded Q about one-half said high loaded Q.

7. The method as claimed in claim 6 wherein the tuning of the output of said second stage is below said center frequency.

8. The method as claimed in claim 7 wherein the amount of tuning below the center frequency is approximately half the —3 db bandwidth of the second stage.

References Cited

UNITED STATES PATENTS

| | | | |
|---|---|---|---|
| 1,921,088 | 8/1933 | MacDonald | 335—154 |
| 2,802,066 | 8/1957 | Woll | 330—154 |
| 3,061,792 | 10/1962 | Erbinge | 330—21 |

FOREIGN PATENTS

| | | |
|---|---|---|
| 579,725 | 7/1959 | Canada. |

ROY LAKE, Primary Examiner

J. B. MULLINS, Assistant Examiner

U.S. Cl. X.R.

330—112, 154